United States Patent
Pahl (10) Patent No.: US 11,956,579 B2
(45) Date of Patent: Apr. 9, 2024

(54) LID, MEMS SENSOR COMPONENT AND METHODS OF MANUFACTURING

(71) Applicant: TDK Corporation, Tokyo (JP)

(72) Inventor: Wolfgang Pahl, Munich (DE)

(73) Assignee: TDK Corporation, Tokyo (JP)

( * ) Notice: Subject to any disclaimer, the term of this patent is extended or adjusted under 35 U.S.C. 154(b) by 179 days.

(21) Appl. No.: 17/693,009

(22) Filed: Mar. 11, 2022

(65) Prior Publication Data

US 2022/0329924 A1    Oct. 13, 2022

(30) Foreign Application Priority Data

Apr. 13, 2021  (DE) .......................... 102021109180.2

(51) Int. Cl.
*H04R 1/04* (2006.01)
*B22F 10/28* (2021.01)
(Continued)

(52) U.S. Cl.
CPC ................ *H04R 1/04* (2013.01); *B33Y 80/00* (2014.12); *H04R 19/04* (2013.01); *B22F 10/28* (2021.01);
(Continued)

(58) Field of Classification Search
CPC ......... B33Y 80/00; B33Y 10/00; B22F 10/28; B81B 7/0032; B81B 3/007; B81B 2201/0257; B81B 2203/0127; B81B 3/0072; B81B 7/0058; B81B 7/0077; B81B 2201/0235; B81B 2203/0315; B81B 2207/012; B81B 2207/09; B81B 2207/092; B81B 2207/096; B81B 7/0064; H04R 2201/029; H04R 1/222; H04R 19/04; H04R 7/04; H04R 7/18; H04R 2201/003;
(Continued)

(56) References Cited

U.S. PATENT DOCUMENTS

| 7,381,589 B2 | 6/2008 | Minervini |
| 8,536,663 B1 * | 9/2013 | Kuo ........................ H01L 24/97 438/125 |

(Continued)

FOREIGN PATENT DOCUMENTS

| DE | 102015102884 A1 | 9/2015 | |
| WO | WO-2013140449 A1 * | 9/2013 | ......... B81C 1/00333 |
| WO | 2021057109 A1 | 4/2021 | |

OTHER PUBLICATIONS

3-D Printing, Wikipedia, https://de.wikipedia.org/wiki/3D-Druck, May 31, 2021, 43 pages.

*Primary Examiner* — Angelica M McKinney
(74) *Attorney, Agent, or Firm* — Slater Matsil, LLP (57) ABSTRACT

In an embodiment a lid includes a top section and a side section arranged below the top section. A vertical height of the top section is calculated by $I_{TS}*H_B$, $I_{TS}$ being a first multiple integer and $H_B$ being a basic height, and a vertical height of the side section is calculated by $I_{ss}* H_B$, $I_{ss}$ being a second multiple integer and HB being the basic height $H_B$.

20 Claims, 5 Drawing Sheets

(51) Int. Cl.
  *B33Y 10/00*    (2015.01)
  *B33Y 80/00*    (2015.01)
  *B81B 7/00*     (2006.01)
  *H04R 19/04*    (2006.01)

(52) U.S. Cl.
  CPC ............. *B33Y 10/00* (2014.12); *B81B 7/0032* (2013.01); *H04R 2201/003* (2013.01); *H04R 2201/029* (2013.01)

(58) Field of Classification Search
  CPC .. H04R 7/20; H04R 2207/021; H04R 19/005; H04R 1/04; H04R 1/2807; H04R 1/342; H04R 1/083; H04R 17/02; H04R 17/10; H04R 19/016; H04R 2201/02; H04R 2217/00; B81C 1/00269; B81C 1/00888; B81C 2201/034; B81C 2203/0118; B81C 2203/032; B81C 2203/0792
  See application file for complete search history.

(56)                References Cited

U.S. PATENT DOCUMENTS 9,818,665  B2     11/2017  Elian et al.
  10,435,292 B2 *   10/2019  Waechter ............ B81C 1/00269
  2016/0204073 A1   7/2016   Beak et al.
  2017/0257687 A1   9/2017   Kierse et al.
  2019/0207582 A1   7/2019   Wainerdi et al.

* cited by examiner

LID, MEMS SENSOR COMPONENT AND METHODS OF MANUFACTURING

CROSS-REFERENCE TO RELATED APPLICATIONS

This application claims priority to German Patent Application No. 102021109180.2, filed on Apr. 13, 2021, which application is hereby incorporated herein by reference.

TECHNICAL FIELD

MEMS sensors, in particular MEMS microphones, are usually assembled on a carrier or packaging substrate (e.g. a multilayer organic or ceramic laminate with internal electrical routing) that accommodates a MEMS chip, e.g. a sensor chip and optionally additional active and passive circuit parts. The chip or the circuit parts are covered by a metal lid that is attached to the carrier in a peripheral region by means of glue or solder. Typically, the carrier provides a plurality (several hundred) of individual component sites, whereas the metal lid is handled and attached as a single part per component site.

BACKGROUND

This is related to the manufacturing of such metal lids. They are formed from a raw metal strip by means of progressive stamping tools in several deep drawing steps. When the final shape is achieved, the lids are being punched out of the strip by a last stamping tool.

This requires some lateral clearance between the upper and lower cutting edges ("cutting gap") of this stamping tool, and, as a consequence, leads to the typical foot of such lids. The dimension of the foot adversely increases the total package size in the order of 50 μm per edge.

The foot dimension is difficult to control. Typically, it is >60% of the thickness of the side section of the lid, with the latter being in the order of 100 μm. Therefore, a dicing process of the completed assembly of carriers with lids has to keep off the foot.

Moreover, the nature of the deep drawing process as well as the limited ductility of suitable metals limits the available materials for the lid. Further, the materials properties set limits for the sharpness of the radius at horizontal edges as well as at vertical edges. Similar to the mentioned foot, this reduces the effective inner volume of the lid for a given total package size.

In contrast to many other electronic components, the empty volume in a microphone package is not just dead volume. The so-called back volume is necessary for the compliance of mechanical structures of a MEMS component such as a membrane of a MEMS microphone. Thus, larger back volumes are preferred.

Beside these limitations of the geometry of an individual lid, the deep drawing process does not have the capability to form precise arrays of such lids with several tens of rows and columns, respectively, and the same narrow interspace between the lids that would be required to match the packaging substrate layout.

Correspondingly, the use of conventional lids is slow, cost intensive, and significantly contributes to tolerances and margins affecting the size of the final component.

From U.S. Pat. No. 7,381,589 B2 silicon condenser microphone package with multilayer top lids—independently created from side walls of the packages—are known.

SUMMARY

Embodiments provide an improvement of the achievable back volume in microphones and cost reduction. Further embodiments provide components with improved stability.

The lid comprises a top section and a side section. The side section is arranged below the top section. The vertical height of the top section is $I_{TS}*H_B$. The vertical height of the side section is $I_{SS}*H_B$. $I_{TS}$ and $I_{SS}$ are positive integer numbers. $H_B$ corresponding establishes a basic layer height for the lid.

Specifically, the lid can be regarded as composed of $(I_{TS}+I_{SS})$ times a structure of a vertical height $H_B$.

This is possible because the lid can be constructed—during manufacturing—in an additive manufacturing process where a plurality of layers are stacked one above another. The individual layers can be mechanically connected to one another such that a monolithical lid construction is obtained. In particular, it is possible that after the manufacturing process the initial individual layers are—except an external layer pattern—indistinguishable from one another.

The lid can be provided and adapted to accommodate mechanical and/or electrical parts of a component being selected from a MEMS sensor and a MEMS microphone.

The use of additive manufacturing processes to establish a lid as described above has the advantage that such a lid can be manufactured in a cost-efficient manner and the lid's internal structures can be arranged such that a larger back volume and an increased overall mechanical stability is obtained.

Further, compared to the conventional lids, the material or the material combination of the lid can be adjusted according to its mechanical properties whereas the materials of conventional lids must be chosen such that the material complies with deep drawing requirements.

Correspondingly, it is possible that the top section and the side section comprise a material that is selected from a 3D printable material, alloys, metals, nickel, titanium, brass, stainless steel, a copper alloy, a copper alloy comprising 10% to 70% copper, 10% to 70% nickel and 10% to 70% zinc. Of course, the total number of percentage is limited to 100%. Thus, for example, the alloy can comprise 45% copper, 45% nickel. Then, the zinc content is 10% or less. In this respect, percentage refers to weight % or atomic %.

It is possible that—e.g. due to its nature as composed of individual layers during manufacturing—the side section comprises a groove structure based on the vertical periodicity of $H_B$. Specifically, the side section can comprise the groove structures on its inner or outer surfaces.

It is further possible that the surfaces of the top structure are free from such groove structures because in a 3D printing process the topmost layer of the top section can appear homogenously.

Thus, there can be an anisotropy in the vertical direction compared to surface appearances in a lateral direction.

Further, it is possible that the lid is free from corrugations caused by a raw sheet rolling or by a deep drawing process.

Thus, the optical appearance of a lid as described above is clearly different from the optical appearance of a conventional lid.

It is possible that the lid comprises structures selected from stability structures and/or opening structures. Stability structures can be selected from pillars, struts and strutted pillars. Opening structures can be selected from holes and hole arrays.

The 3D printing process allows structures that are not available with deep drawing processes. Correspondingly, the lid can be supplied with additional structures enhancing the stability at selected locations of the lid. Further, the 3D printing process allows the simple creation of opening structures, e.g. opening structures for acoustic ports or holes to receive an acoustic signal.

Further, it is possible that the lid has a thickness—in the vertical direction—of the top section that is different from a thickness—in a horizontal direction—of the side section by more than 25%.

This is in contrast to conventional lids based on a deep drawing process where the thickness of the initial metal sheet is homogenous or essentially homogeneous and maintains its homogenous thickness—except at locations of edges—over the whole lid structure.

Thus, in the lid stated above, structural properties can be further selected to optimize the internal volume per external volume consumption-ratio.

Specifically, it is possible that the thickness of the top section is smaller than the thickness of the side section. The side section can have an increased thickness that can be used to enhance a mounting process where the lid is mechanically connected to a carrier.

Further, it is possible that the top section and the side section are monolithically connected to one another. Thus, it is possible that there is no phase boundary between a location in the side section and a location in the top section. The provision of a monolithically established homogenous lid further increases the mechanical stability for a given material thickness or lid weight.

Further, it is possible that inner or outer vertical or horizontal edges have a radius smaller than 50 μm.

Specifically, it is possible that the inner or outer vertical or horizontal edges have a radius of the order of the resolution of the printing process which is substantially different from a required minimum radius obtained from a deep drawing process of a conventional metal sheet based lid. This further increases the usable inner volume compared to the overall component dimensions.

It is possible that the lid has a content of metal atoms of a solderable metals or of a solderable alloy that varies along the vertical direction.

In the 3D printing process a meltable or sinterable powder is distributed over an area. After that a scanning energy beam such as a laser beam or an electron beam locally heats the powder such that the heated powder is monolithically added to the material of the layer below. The steps of providing powder and locally solidifying the powder to add the next manufacturing layer are repeated until the last and topmost layer is established. However, during provision of the next layer of powder, the powder composition can be changed such that the composition of different layers of the lid can be different. In this respect it is especially possible that solderable materials are provided at lower layers such that the lid can be easily connected to an external environment, e.g. a carrier, because the solder material is intrinsically obtained in the bottom parts of the side sections of the lid.

Further, it is possible that the lid comprises protrusions or notches. Specifically, the protrusions or notches can be located in the vicinity of the bottom side sections or especially at the bottom surface of the side sections. These protrusions or notches can contain solderable metal or they can be positioned at preferred locations to provide a barrier for solder during a later soldering process.

Further, it is possible that the lid is post-processed in an array by electro plating or electro-less plating.

The processing of the lid characterizes the lid such that the application of these post-processing can be seen from the un-plated dicing edge of the connection portion of the lid.

It is possible that the lid comprises an inner lining made from a material with at least 5 times lower thermal conductivity compared to lid material.

It is possible that a MEMS sensor component comprises a lid as described above. Specifically, the lid can be used to enclose a volume in which sensitive MEMS structures and/or electric or electronic circuitry is arranged.

It is possible that the MEMS sensor component further comprises a carrier with a top side. Then the lid is connected to the top side of the carrier.

Then, the lid and the top side of the carrier enclose a volume. A MEMS chip can be accommodated in the volume that is at least partially enclosed by the carrier and the lid. Openings can be contained in the carrier or in the lid, e.g. to provide an acoustic coupling to the environment of the component.

It is possible that the bottom side of the side section of the lid is mechanically connected, e.g. via solder, to metal structures on the top side of the carrier.

A corresponding method of manufacturing a lid as described above can comprise steps of additive manufacturing processes, e.g. 3D printing processes.

It is possible that the method comprises 3D printing. The 3D printing can involve melting or sintering meltable or sinterable powder to establish a layered structure with a basic layer thickness of $H_B$.

Further, it is possible that the method utilizes a scanning energy beam selected from a laser beam and an electron beam to melt or sinter the powder.

Further, the method of manufacturing the MEMS sensor component can comprise soldering or gluing the lid to the surface of the carrier.

Thus, with the lid as described above, MEMS components with increased back volume, reduced production costs, increased mechanical stability, reduced tolerances and simplified handling during manufacturing are possible.

Conventional materials for the carrier and for metallized structures for signal routing are possible.

BRIEF DESCRIPTION OF THE DRAWINGS

Basic working principles and details of preferred embodiments are shown in the schematic figures.

DETAILED DESCRIPTION OF ILLUSTRATIVE EMBODIMENTS

Figure 1:
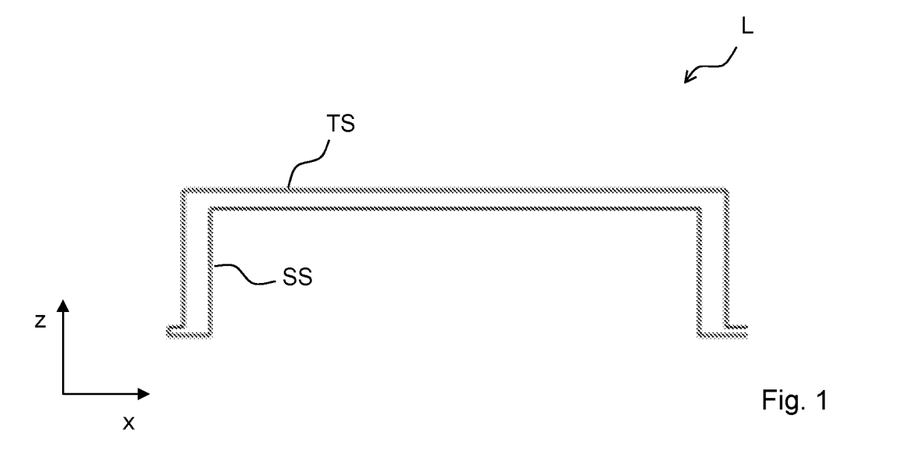
FIG. 1 shows a cross-section through a lid L.

FIG. 1 shows a cross-section through a lid L. The cross-section is perpendicular to the horizontal y direction. The lid L comprises a top section TS and a side section SS.

Along the vertical direction z the lid is constructed out of a plurality of individually melted or sintered layers, allowing the advantages as described above.

Figure 2:
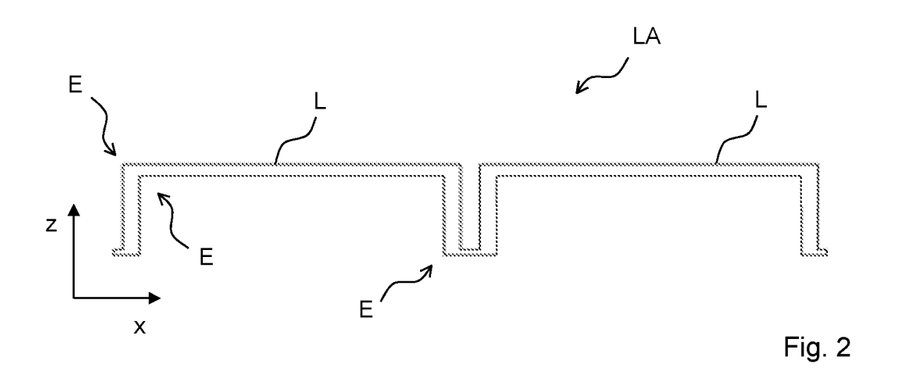
FIG. 2 shows a cross-section through an array comprising two lids.

FIG. 2 illustrates the possibility of creating a plurality of lids L in an array during a common manufacturing process.

Figure 3:
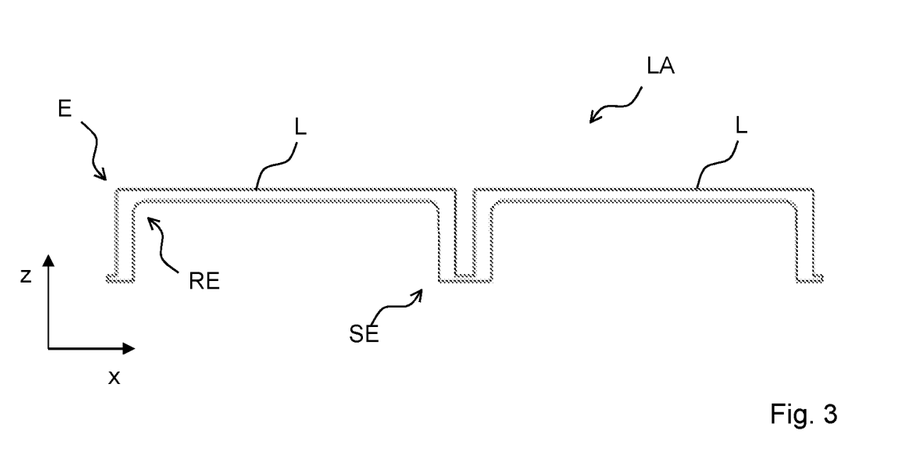
FIG. 3 shows a cross-section through an array of lids with different edge radii.

FIG. 3 illustrates the possibility of providing edges E that can be round edges RE with a relatively large radius and sharp edges SE with relatively small edges, essentially limited by the resolution of the 3D printing process.

Figure 4:
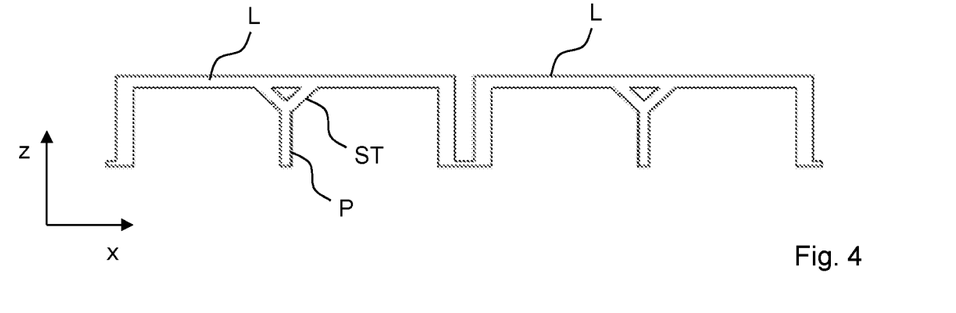
FIG. 4 shows a cross-section through a lid array comprising a pillar and struts per lid for improved stability.

FIG. 4 illustrates the possibility of creating pillars P and struts ST to increase the mechanical stability of sensitive areas of the lid L. It is possible that the pillar P is essentially located in the horizontal center of the volume while the struts mechanically connected the top side of the pillar to the top side of the lid at two or four or more individual locations.

Figure 5:
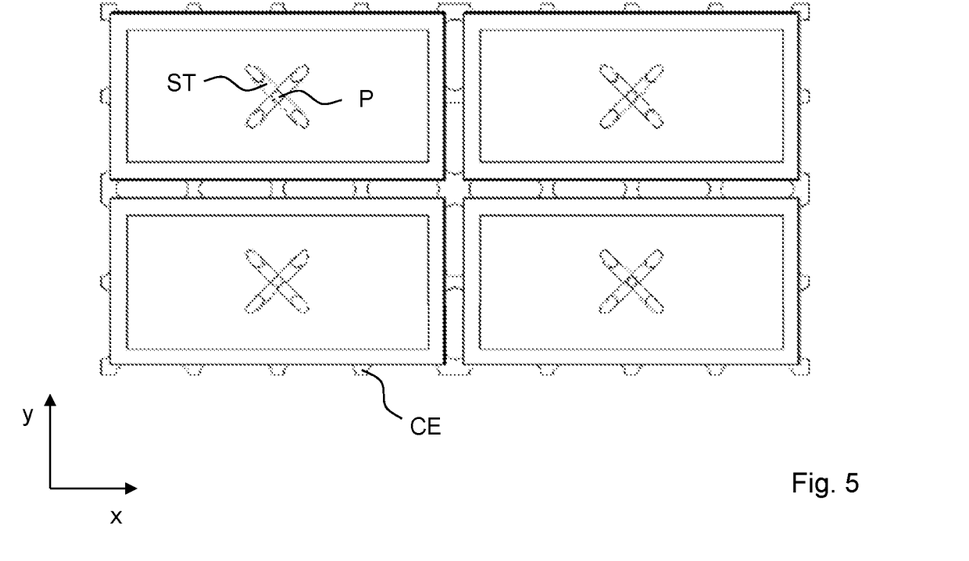
FIG. 5 shows a top view onto a 2×2 array illustrating the horizontal position of the pillar.

FIG. 5 shows an array of lids and the corresponding positions of the pillar P and the struts ST and further shows connection elements CE for mechanically connecting one lid to another such that the plurality of lids can be connected to a plurality of dedicated sides of the carrier in a single connection process. This is just to reduce the amount of metal to be cut in the singularization process. It is also possible to connect the individual lids along their whole edges.

Figure 6:
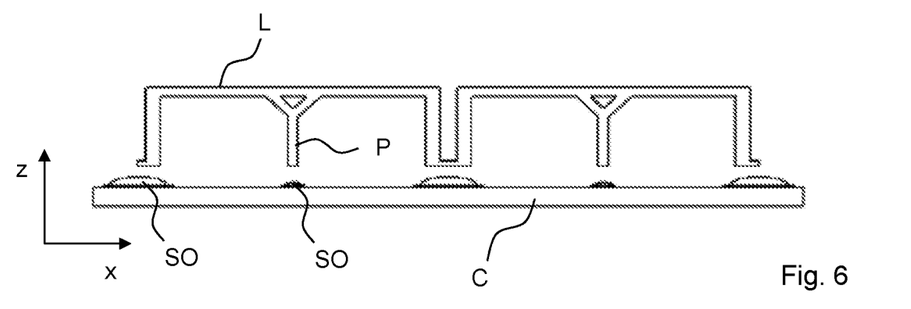
FIGS. 6 and 7 show intermediate steps of processes for manufacturing a MEMS sensor.
Figure 7:
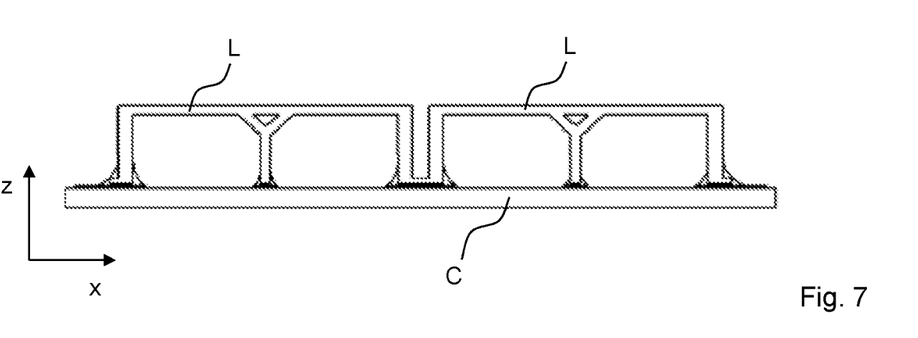

Correspondingly, FIGS. 6 and 7 show the connection process where a solder material SO is arranged on the top side of the carrier C. Bottom sides of the side sections and optionally the bottom side of pillars P (which also may just loosely rest on the carrier C) are then mechanically connected to the solder material SO on the carrier C.

Figure 8:
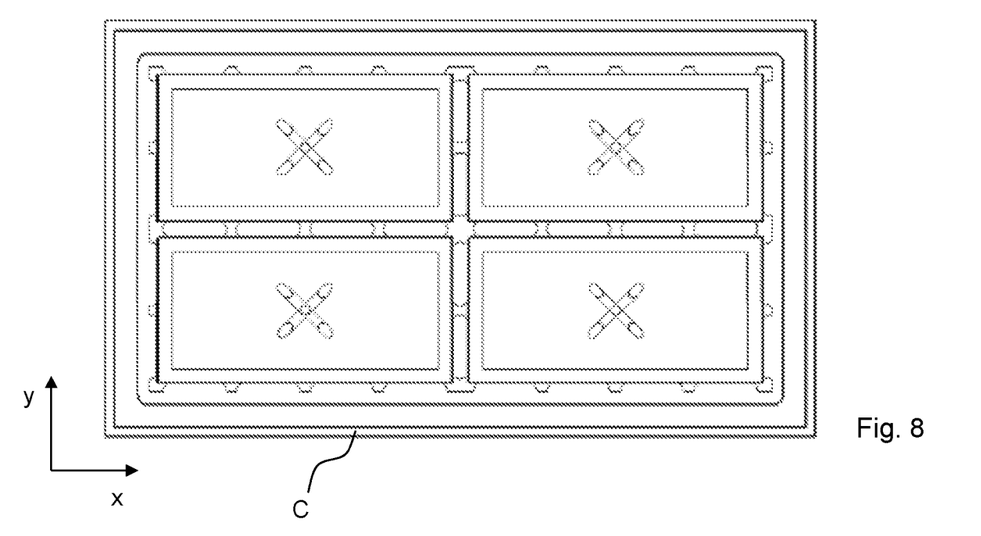
FIG. 8 shows a top view onto a sensor array before dicing.

FIG. 8 shows the component with the carrier C mechanically connected to the lid array before dicing. The thickness in the vertical direction z of the connection element CE between the lids is so small that the dicing process is essentially not disturbed by the connection elements CE between the lids is so small that the dicing process is essentially not disturbed by the connection elements. Thus, tolerances can be reduced and the volume of the component can be used more efficiently.

Figure 9:
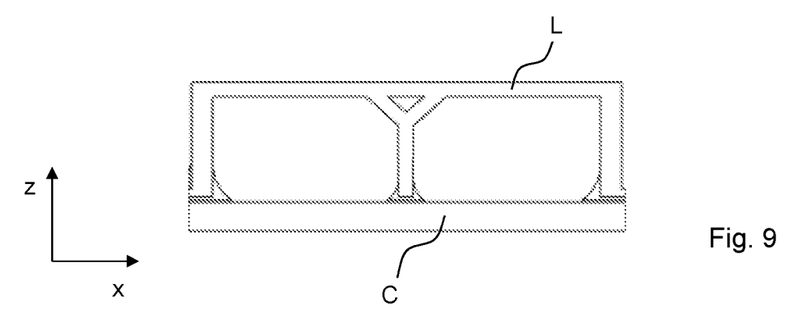
FIG. 9 shows a cross-section through a singulated component.
Figure 10:
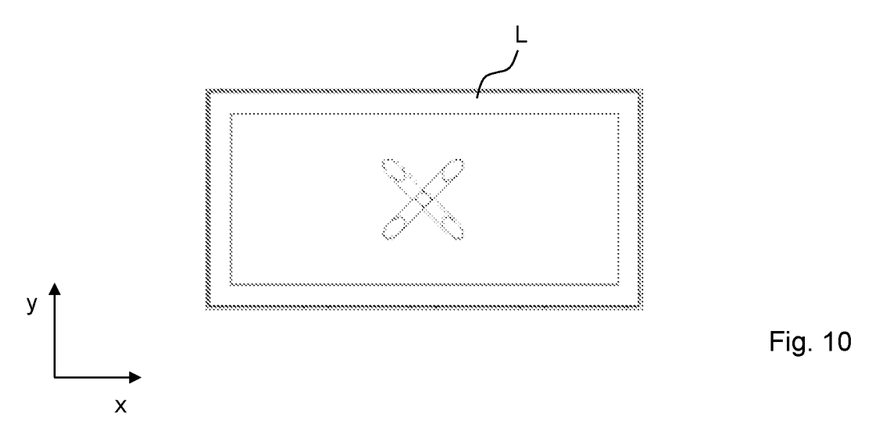
FIG. 10 shows a top view onto a singulated component.

Correspondingly, FIGS. 9 and 10 show the component in a cross-section (FIG. 9) and in a top view (FIG. 10) after dicing.

Figure 11:
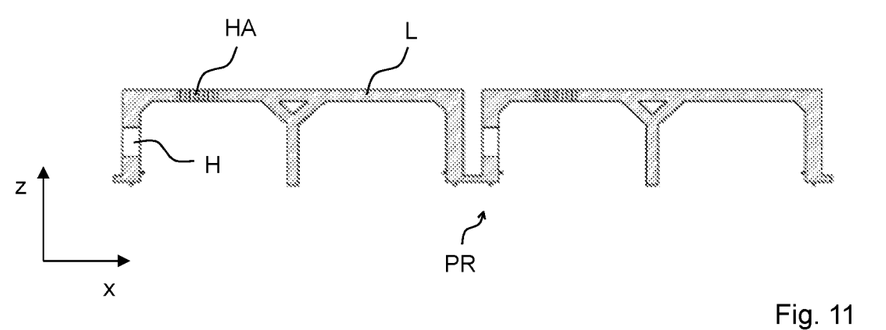
FIG. 11 shows a cross-section through a lid array where each lid comprises a hole at the side and a hole array at the top.

FIG. 11 shows the possibility of providing larger holes H, e.g. at sidewalls of the lid L and/or a hole array HA comprising a plurality of smaller holes, e.g. at the top side of the lid.

Further, FIG. 11 shows the use of protrusions PR at the bottom side of the lid or at the bottom side of the side section of the lid. The protrusions can be used as spacers and as materials specifically dedicated to be soldered and as solder stop structures to prevent solder from covering areas of the lid to which no solder shall be applied.

Figure 12:
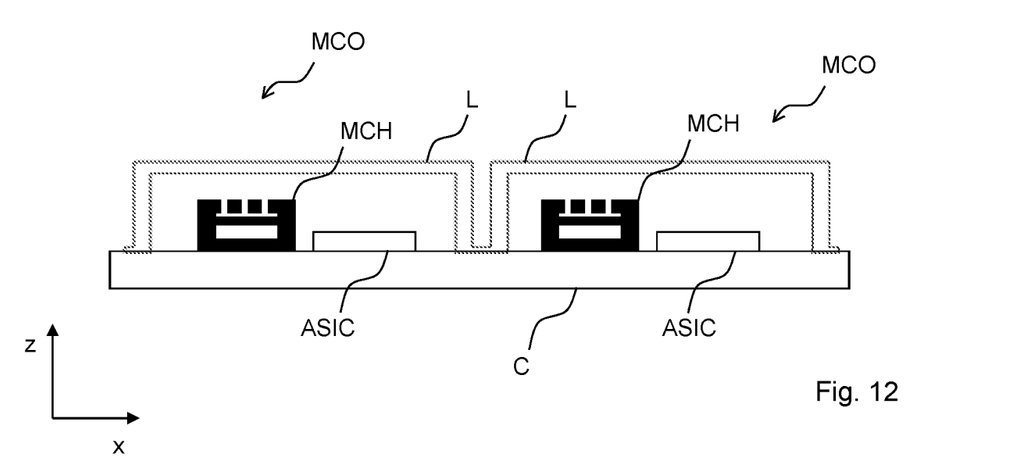
FIG. 12 shows a cross-section through a component array where each component comprises a MEMS chip and an ASIC chip.

FIG. 12 shows an array of MEMS components comprising a MEMS chip MCH in the volume accommodated by the lid L and by the carrier C. Further, the MEMS component MCO comprises a further chip that can be used to accommodate circuitry of an ASIC (application-specific integrated circuit).

Figure 13:
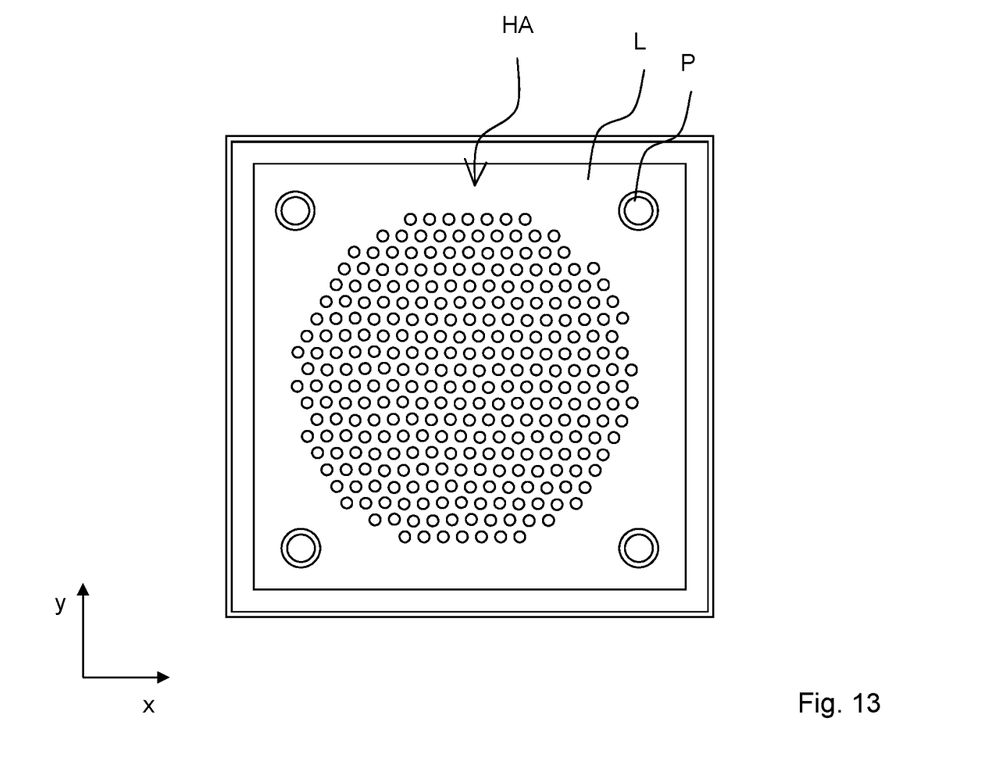
FIG. 13 shows a top view onto a MEMS component comprising a regular pattern of holes establishing a hole array.

FIG. 13 shows the possibility of providing holes in a hexagonal pattern of the hole array HA at the top side of the lid and the provision of pillars P for providing stability in a vertical direction.

The lid, the MEMS component and the methods for manufacturing are not limited to the embodiments and details described above and shown in the figures. The lid can comprise further structures and elements for mechanical or electrical purposes. Specifically, the lid can comprise a conducting material or comprise a layer of a conducting material that is electrically connected to a ground potential of the corresponding MEMS component to provide shielding.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A lid comprising:
   a top section; and
   a side section below the top section,
   wherein a vertical height of the top section is $I_{TS}*H_B$, $I_{TS}$ being a first multiple integer and $H_B$ being a basic height, and
   wherein a vertical height of the side section is $I_{SS}*H_B$, $I_{SS}$ being a second multiple integer and $H_B$ being the basic height $H_B$.

2. The lid according to claim 1, wherein the lid is configured to accommodate mechanical and/or electrical parts of a component being selected from a micro electro mechanical system (MEMS) sensor or a MEMS microphone.

3. The lid according to claim 1, wherein the top section and the side section comprise a material selected from a three-dimensional (3D) printable material, alloys, metals, nickel, titanium, brass, stainless steel, a copper alloy, or a copper alloy comprising 10% to 70% copper, 10% to 70% nickel and 10% to 70% zinc.

4. The lid according to claim 1, wherein the side section comprises—on its surfaces—a groove structure based on a vertical periodicity $H_B$.

5. The lid according to claim 1, wherein the lid is free from corrugations caused by a raw sheet rolling or by a deep drawing process.

6. The lid according to claim 1, further comprising structures selected from stability structures selected from pillars, struts, strutted pillars and/or opening structures selected from holes and hole arrays.

7. The lid according to claim 1, wherein a thickness—in a vertical direction—of the top section is different from a thickness—in a horizontal direction—of the side section by more than 25%.

8. The lid according to claim 1, wherein the top section and the side section are monolithically connected to one another.

9. The lid according to claim 1, wherein inner or outer edges of the lid have a radius smaller than 50 μm.

10. The lid according to claim 1, wherein a content of metal atoms of solderable metals or alloys varies along a vertical direction.

11. The lid according to claim 1, further comprising protrusions or notches at a bottom side of the side sections.

12. The lid according to claim 1, wherein the lid is post-processed in an array by electro plating or electro-less plating.

13. The lid according to claim 1, further comprising an inner lining made from a material with at least 5 times lower thermal conductivity compared to a lid material.

14. A micro electro mechanical system (MEMS) sensor component comprising:
the lid according to claim 1.

15. The MEMS sensor component according to claim 14, further comprising a carrier with a top side, wherein the lid is connected to the top side of the carrier.

16. The MEMS sensor component according to claim 15, further comprising a MEMS chip accommodated in a volume at least partially enclosed by the carrier and the lid.

17. The MEMS sensor component according to claim 15, wherein a bottom side of the side section of the lid is mechanically connected to metal structures on the top side of the carrier via soldering or gluing the lid to a surface of the carrier.

18. A method for manufacturing the lid according to claim 1, the method comprising:
providing an additive manufacturing process.

19. The method according to claim 18, wherein the additive manufacturing process comprises 3D printing involving melting or sintering meltable or sinterable powder to establish a layered structure with a layer thickness of $H_B$.

20. The method according to claim 19, further comprising utilizing an energy beam selected from a laser beam or an electron beam to melt or sinter the powder.

* * * * *

UNITED STATES PATENT AND TRADEMARK OFFICE
CERTIFICATE OF CORRECTION

PATENT NO. : 11,956,579 B2
APPLICATION NO. : 17/693009
DATED : April 9, 2024
INVENTOR(S) : Wolfgang Pahl It is certified that error appears in the above-identified patent and that said Letters Patent is hereby corrected as shown below:

In the Claims

In Column 6, in Claim 5, Line 51, delete "a drawing" and insert -- drawing --.

Signed and Sealed this
Twenty-eighth Day of May, 2024

Katherine Kelly Vidal
*Director of the United States Patent and Trademark Office*